United States Patent
Knisley et al.

(10) Patent No.: US 12,435,411 B2
(45) Date of Patent: Oct. 7, 2025

(54) METAL ORGANONITRILE PRECURSORS FOR THIN FILM DEPOSITION

(71) Applicants: Applied Materials, Inc., Santa Clara, CA (US); Wayne State University, Detroit, MI (US)

(72) Inventors: Thomas Joseph Knisley, Livonia, MI (US); Bhaskar Jyoti Bhuyan, San Jose, CA (US); Mark Saly, Santa Clara, CA (US); Shalini Tripathi, Detroit, MI (US); Charles H. Winter, Bloomfield Hills, MI (US); Zachary J. Devereaux, Webberville, MI (US)

(73) Assignees: Applied Materials, Inc., Santa Clara, CA (US); Wayne State University, Detroit, MI (US)

( * ) Notice: Subject to any disclaimer, the term of this patent is extended or adjusted under 35 U.S.C. 154(b) by 84 days.

(21) Appl. No.: 18/195,052

(22) Filed: May 9, 2023

(65) Prior Publication Data

US 2024/0301549 A1    Sep. 12, 2024

Related U.S. Application Data

(60) Provisional application No. 63/451,375, filed on Mar. 10, 2023.

(51) Int. Cl.
  *C23C 16/18* (2006.01)
  *C07F 11/00* (2006.01)

(52) U.S. Cl.
  CPC ............ *C23C 16/18* (2013.01); *C07F 11/005* (2013.01)

(58) Field of Classification Search
  CPC ...................................................... C23C 16/18
  See application file for complete search history.

(56) References Cited

U.S. PATENT DOCUMENTS

| 3,936,490 A | 2/1976 | Hofmann et al. |
| 2016/0200586 A1 | 7/2016 | Forsyth et al. |
| 2021/0407809 A1* | 12/2021 | Zope ................. H01L 21/76843 |

OTHER PUBLICATIONS

JP 2009033125 machine translation (Year: 2009).*
Jimtaisong et al. Inorg. Chem. 2006, 45, p. 10391-10402. (Year: 2006).*
Santos et al. J. Chem. Soc. Dalton Trans. 2001 p. 1332-1337. (Year: 2001).*
Kuhn et al. J. Molecular Catalysis A: Chem, 151 (2000) p. 147-160. (Year: 2000).*
Valente et al. New. J. Chem. 2004, 28, 308-313. (Year: 2004).*

* cited by examiner

*Primary Examiner* — Kelly M Gambetta
(74) *Attorney, Agent, or Firm* — SERVILLA WHITNEY LLC

(57) ABSTRACT

Metal complexes with nitrile ligands of the type $MO_2X_2L_2$, where M is molybdenum or tungsten, X is a halogen, each L is independently an organonitrile ligand with the general formula NCR, where each R is independently a C2-C18 group. Metal complexes with dinitrile bidentate ligands of the type $MO_2X_2L'$, where L' is a dintrile ligand, and dinitrile bridging ligands of the type $(MO_2X_2)_2L'$, where L' is a dinitrile bridging ligand connecting the two metal atoms. Methods of making and using the metal complexes are described.

20 Claims, No Drawings

METAL ORGANONITRILE PRECURSORS FOR THIN FILM DEPOSITION

CROSS-REFERENCE TO RELATED APPLICATIONS

This application claims priority to U.S. Provisional Application No. 63/451,375, filed Mar. 10, 2023, the entire disclosure of which is hereby incorporated by reference herein.

TECHNICAL FIELD

Embodiments of the disclosure generally relate to organonitrile containing precursors for thin film deposition and deposition processes using the organonitrile precursors. In particular, embodiments of the disclosure relate to molybdenum and tungsten precursors with organonitrile ligands and methods for forming molybdenum and tungsten films.

BACKGROUND

Reliably producing submicron and smaller features is one of the key requirements of very large scale integration (VLSI) and ultra large scale integration (ULSI) of semiconductor devices. However, with the continued miniaturization of circuit technology, the dimensions of the size and pitch of circuit features, such as interconnects, have placed additional demands on processing capabilities. The various semiconductor components (e.g., interconnects, vias, capacitors, transistors) require precise placement of high aspect ratio features. Reliable formation of these components is critical to further increases in device and density.

Additionally, the electronic device industry and the semiconductor industry continue to strive for larger production yields while increasing the uniformity of layers deposited on substrates having increasingly larger surface areas. These same factors in combination with new materials also provide higher integration of circuits per unit area on the substrate. The need for greater process control regarding layer characteristics increases with the movement to smaller device features.

To date, there are no liquid molybdenum-based precursors for forming films that meet stringent manufacturing performance specifications. Current molybdenum and tungsten precursors are expensive and tend to be solid materials with low volatility. Accordingly, there is a need in the art for molybdenum and tungsten precursors with higher volatility.

SUMMARY

One or more embodiments of the disclosure are directed to metal complexes with nitrile ligands of the type $MO_2X_2L_2$, where M is molybdenum or tungsten, X is a halogen, each L is independently an organonitrile ligand with the general formula NCR, where R a C2-C18 group.

Additional embodiments of the disclosure are directed to methods of depositing a film. The methods comprise exposing a substrate surface to a metal complex with nitrile ligands of the type $MO_2X_2L_2$, where M is molybdenum or tungsten, each X is independently a halogen, each L is independently an organonitrile ligand with the general formula NCR, where R is a C2-C18 group, and a reductant.

Further embodiments of the disclosure are directed to methods of depositing a film, the method comprising exposing a substrate surface to a metal complex with nitrile ligands of the type $(MO_2X_2)_2L'$, where M is a metal atom, and L' is a dinitrile bridging ligand connecting the two molybdenum atoms, and a reductant.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate surface.

As used in this specification and appended claims, "substrate support" and "substrate support pedestal" may be used interchangeably.

As used in this specification and appended claims, use of relative terms like "above" and "below" should not be taken as limiting the scope of the disclosure to a physical orientation in space. Accordingly, use of relative terms should not be limited to the direction specified by gravity.

$MoO_2Cl_2$ is a suitable precursor for molybdenum metal deposition. However, the chemistry has drawbacks: the complex is a high melting point solid (mp=175° C.) which introduces chemical delivery challenges; and use of the complex is expensive as onboard chemical delivery ampoules need to be periodically replaced, introducing tool down time. Some embodiments of the disclosure provide liquid precursors which simplify the delivery process and allow for greater tool utilization, lowering the cost-of-ownership for semiconductor manufacturer.

One or more embodiments of the disclosure provide $MO_2Cl_2$-acetonitrile adducts that are low melting solids and more volatile than the parent $MO_2Cl_2$ complex. By shifting to a liquid precursor for deposition processes, the chemical delivery process can be greatly simplified and allow for greater tool utilization and lower cost-of-ownership.

MoO$_2$Cl$_2$, for example, has some inherent drawbacks for use as a molybdenum precursor for film deposition. The inventors have found that liquid or low-melting MoO$_2$Cl$_2$ adducts provide excellent reactivity to deposit high performing molybdenum-containing layers and/or simplify precursor chemical delivery leading to higher tool utilization and lower cost-of-ownership. Similarly, WO$_2$Cl$_2$ adducts provide excellent reactivity to deposit high performing tungsten-containing layers.

Some embodiments of the disclosure are directed to metal complexes with nitrile ligands of the type MO$_2$X$_2$L$_2$, where M is molybdenum or tungsten, X is a halogen, each L is independently an organonitrile ligand with the general formula NCR, where R is a C2-C18 group, or a C2-C16 group, or a C2 to C12 group, or a C2 to C10 group, or a C2-C8 group, or a C2-C6 group. As used in this manner a capital letter C followed by a number (e.g., C6) refers to a carbon containing group with the specified number of carbon atoms. For example, a C6 group has six carbon atoms.

Some embodiments of the disclosure are directed to molybdenum complexes having the general formula MoO$_2$X$_2$L$_2$, where each X is independently a halogen, each L is independently an organonitrile ligand with the general formula NCR, where R is a C2-C18 group, or a C2-C16 group, or a C2 to C12 group, or a C2 to C10 group, or a C2-C8 group, or a C2-C6 group. Some embodiments are directed to tungsten complexes having the general formula WO$_2$X$_2$(NCR)$_2$, where each X is independently a halogen and each R is independently a C2-C18 group, or a C2-C16 group, or a C2 to C12 group, or a C2 to C10 group, or a C2-C8 group, or a C2-C6 group. Some embodiments of the disclosure are directed to molybdenum complexes having the general formula MoO$_2$X$_2$L$_2$, where each X is independently a halogen and each L is independently an organonitrile ligand with the general formula NCR, where R is a C2-C10 group or R group described below. Some embodiments are directed to tungsten complexes having the general formula WO$_2$X$_2$(NCR)$_2$, where each X is independently a halogen and each R is independently a C2-C18 group, or a C2-C16 group, or a C2 to C12 group, or a C2 to C10 group, or a C2-C8 group, or a C2-C6 group or R group described below.

In some embodiments, each halogen atom is independently Cl, Br or I. In some embodiments, both of the halogen atoms are the same. In some embodiments, both halogen atoms are chlorine atoms. In some embodiments, both halogen atoms are bromine atoms. In some embodiments, both halogen atoms are iodine atoms. In some embodiments, one halogen atom is a chlorine atom and the other halogen atom is a bromine or iodine atom. In some embodiments, one halogen atom is a bromine atom and the other halogen is a chlorine or iodine atom.

In some embodiments, L ligand is independently an organonitrile ligand having the general formula NCR, where R is a C2-C18 group, or a C2-C16 group, or a C2 to C12 group, or a C2 to C10 group, or a C2-C8 group, or a C2-C6 group. In some embodiments, both L ligands have the same R group. In some embodiments, each R group is independently a linear alkylnitrile group. In some embodiments, each R group is independently a linear or branched alkylnitrile group. In some embodiments, at least one R group comprises only carbon-carbon single bonds. In some embodiments, at least one R group comprises at least one carbon-carbon double bond. In some embodiments, at least one R group comprises at least one carbon-carbon triple bond. In some embodiments, at least one R group comprises at least one cyclic organonitrile ligand.

In some embodiments, each L ligand comprises one or more of any of structures (L$_1$) through (L$_5$)

Propionitrile

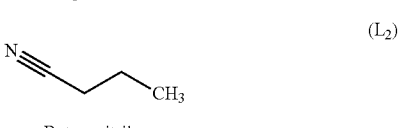

Butyronitrile

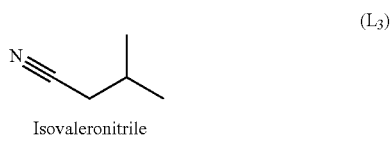

Isovaleronitrile

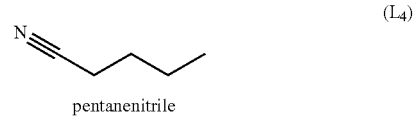

pentanenitrile

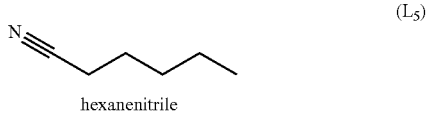

hexanenitrile

Some embodiments of the disclosure are directed to molybdenum complexes having the general formula MoO$_2$X$_2$L$_2$, where each X is independently a halogen, each L is independently an organonitrile ligand with the general formula NCR, where R is a C2-C18 group, or a C2-C16 group, or a C2-C14 group, or a C2-C12 group, or a C2-C10 group, or a C2-C8 group or a C2-C6 group. Some embodiments are directed to tungsten complexes having the general formula WO$_2$X$_2$(NCR)$_2$, where each X is independently a halogen and each R is independently a C2-C18 group, or a C2-C16 group, or a C2-C14 group, or a C2-C12 group, or a C2-C10 group, or a C2-C8 group or a C2-C6 group. Some embodiments of the disclosure are directed to molybdenum complexes having the general formula MoO$_2$X$_2$L$_2$, where each X is independently a halogen and each L is independently an organonitrile ligand with the general formula NCR, where R is a C2-C10 group. Some embodiments are directed to tungsten complexes having the general formula WO$_2$X$_2$(NCR)$_2$, where each X is independently a halogen and each R is independently a C2-C10 group.

Some embodiments of the disclosure are directed to molybdenum complexes having the general formula MO$_2$X$_2$ (L'), where M is tungsten or molybdenum, each X is independently a halogen, L' is a dinitrile such as adiponitrile (NCCH$_2$CH$_2$CH$_2$CH$_2$CN) or 1,6-hexanedinitrile (NCCH$_2$CH$_2$CH$_2$CH$_2$CH$_2$CH$_2$CN). In some embodiments, each X is a chorine atom.

In some embodiments, the dinitrile ligand is a bidentate ligand with both nitrile groups coordinated with the same metal atom. For example, the adiponitrile ligand coordinated with a single molybdenum atom through both nitrile groups, as shown in Structure I

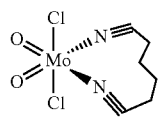

(I)

In some embodiments, the dinitrile ligand acts as a bridge between two metal atoms, rather than forming bidentate chelating dinitrile ligands. For example, where M is molybdenum, the bridging ligand L' connects both molybdenum atoms. However, the complexes are volatile, but less so than $MoO_2Cl_2$. Additionally, the melting points of complexes with a bridging L' ligand have high melting points relative to non-bridged complexes. The bridged dinitrile ligand containing compound of some embodiments has the general formula $(MoO_2X_2)_2$-L' or $O_2X_2Mo$-L'-$MoO_2X_2$, where L' is a dinitrile ligand that bridges the two Mo atoms and each X is independently a halogen. In some embodiments, each X is a chlorine atom.

In some embodiments, the dinitrile ligands include, but are not limited to compounds having the general formula $NC(CH_2)_xCN$, where x is in the range of 2 to 10, or in the range of 3 to 8, or in the range of 4 to 6. Stated differently, suitable bridging dinitrile ligands include in the range of 2 to 10, 3 to 8 or 4 to 6 methylene units. In some embodiments, the dinitrile ligands include, but are not limited to compounds having two nitrile groups connected by an alkyl, alkenyl, alkynyl, branched alkyl, branched alkenyl or branched alkynyl group having in the range of 2 to 18 carbon atoms.

In some embodiments, the molybdenum complex has a mixed chelating nitrile ligand with other Lewis bases. For example, the mixed chelating nitrile ligand of some embodiments has a general formula NC—R-E, R is where E is $NR_2$, or other Lewis bases. The R groups can be any suitable organic group having in the range of 2 to 18 carbon atoms, or an R group as described herein.

In some embodiments, one or more of the L ligands, in any of the disclosed molybdenum or tungsten complexes comprises a primary, secondary, or tertiary amine, or an alkyl ether. In some embodiments, at least one L ligand is a primary (—$NH_2R$), secondary (—$NHR_2$) or tertiary amine (—$NR_3$), where each R group independent has in the range of 2 to 18 carbon atoms. The R groups of the amine ligands can be linear or branched hydrocarbons with only carbon-carbon single bonds, one or more carbon-carbon double bonds, or one or more carbon-carbon triple bonds.

EXAMPLES

Synthesis of $MoO_2Cl_2(RCN)_2$ complexes were formed by addition of an alkylnitrile (e.g., $CH_3CN$) to a solution of $MoO_2Cl_2$ in diethyl ether under inert conditions and stirred for about 60 minutes. The solution was filtered and the solvent was removed under vacuum. Thermogravimetric analysis (TGA) and melting points were determined for each complex. The results are collected in Table 1.

TABLE 1

| Complex | TGA T50 | Melting Point (° C.) |
| --- | --- | --- |
| $MoO_2Cl_2$ | 147 | 175 |
| $MoO_2Cl_2(CH_3CN)_2$ | 128 | 172 |
| $MoO_2Cl_2(L_1)_2$ | 105 | 73 |
| $MoO_2Cl_2(L_2)_2$ | 109 | 42 |

TABLE 1-continued

| Complex | TGA T50 | Melting Point (° C.) |
| --- | --- | --- |
| $MoO_2Cl_2(L_3)_2$ | 109 | 91 |
| $MoO_2Cl_2(L_4)_2$ | 118 | 31 |
| $MoO_2Cl_2(L_5)_2$ | 116 | 30 |

In some embodiments, the $MoO_2Cl_2(RCN)_2$ complex has a melting point less than or equal to 100° C. In some embodiments, the $MoO_2Cl_2(RCN)_2$ complex has a melting point less than or equal to 90° C., 80° C., 75° C., 70° C., 60° C., 50° C., 40° C. or 35° C. In some embodiments, the metal dioxydichlorodialkylnitride complex has a lower melting point and is more volatile than the parent metal dioxydichloride complex.

Some embodiments of the disclosure are directed to methods of forming metal films using a metal complexes with nitrile ligands of the type $MO_2X_2L_2$, where M is molybdenum or tungsten, X is a halogen, each L is independently an organonitrile ligand with the general formula NCR, where R a C2-C10 group. In some embodiments, a metal film is formed by chemical vapor deposition using the metal complex and a suitable reductant. In some embodiments, a metal film is formed by atomic layer deposition using the metal complex and a suitable reductant.

Suitable reductants include, but are not limited to, molecular hydrogen. In some embodiments, the deposition process is a thermal process (i.e., without plasma). In some embodiments, the deposition process is a plasma process where one or more of the metal complex or the reductant is plasma based.

In some embodiments, an ampoule containing the metal complex with nitrile ligands of the type $MO_2X_2L_2$, where M is molybdenum or tungsten, X is a halogen, each L is independently an organonitrile ligand with the general formula NCR, where R a C2-C10 group, is heated to a temperature above the melting point of the metal complex to form a liquid precursor. A carrier gas is flowed through the ampoule with the liquid precursor to provide a flow of gas including the metal complex to the processing chamber.

Clause 1. A metal complex with nitrile ligands of the type $MO_2X_2L_2$, where M is molybdenum or tungsten, each X is independently a halogen, each L is independently an organonitrile ligand with the general formula NCR, where R is a C2-C18 group.

Clause 2. The metal complex of clause 1, wherein M is molybdenum.

Clause 3. The metal complex of clause 1, wherein M is tungsten.

Clause 4. The metal complex of any of clauses 1 to 3, wherein each halogen is a chlorine atom.

Clause 5. The metal complex of any of clauses 1 to 4, wherein each L is propionitrile ($NCCH_2CH_3$).

Clause 6. The metal complex of any of clauses 1 to 4, wherein each L is butyronitrile ($NC(CH_2)_2CH_3$).

Clause 7. The metal complex of any of clauses 1 to 4, wherein each L is isovaleronitrile ($NCCH_2CH(CH_3)_2$).

Clause 8. The metal complex of any of clauses 1 to 4, wherein each L is pentanenitrile ($NC(CH_2)_3CH_3$).

Clause 9. The metal complex of any of clauses 1 to 4, wherein each L is hexanenitrile ($NC(CH_2)_4CH_3$).

Clause 10. The metal complex of any of clauses 1 to 9, wherein a melting point of the metal complex is less than or equal to 100° C.

Clause 11. The metal complex of any of clauses 1 to 9, wherein a melting point of the metal complex is less than or equal to 75° C.

Clause 12. The metal complex of any of clauses 1 to 9, wherein a melting point of the metal complex is less than or equal to 50° C.

Clause 13. The metal complex of any of clauses 1 to 9, wherein a melting point of the metal complex is less than or equal to 35° C.

Clause 14. A method of depositing a film, the method comprising exposing a substrate surface to a metal complex with nitrile ligands of the type $MO_2X_2L_2$, where M is molybdenum or tungsten, each X is independently a halogen, each L is independently an organonitrile ligand with the general formula NCR, where R a C2-C18 group, and a reductant.

Clause 15. The method of clause 14, further comprising heating an ampoule containing the metal complex as a solid to a temperature greater than or equal to a melting point of the metal complex and flowing a carrier gas through the ampoule.

Clause 16. The method of clause 14 or 15, wherein the metal is molybdenum.

Clause 17. The method of clause 14, wherein the metal is tungsten.

Clause 18. A method of depositing a film, the method comprising exposing a substrate surface to a metal complex with nitrile ligands of the type $(MO_2X_2)_2L'$, where M is a metal atom, and L' is a dinitrile bridging ligand connecting the two molybdenum atoms, and a reductant.

Clause 19. The method of clause 18, wherein each of the metal atoms is molybdenum.

Clause 20. The method of clause 18, wherein each of the metal atoms is tungsten.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structure", "materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A metal coordination complex having a general formula $MO_2X_2L_2$, where M is a metal selected from molybdenum or tungsten, each X is independently a halogen, each L is independently an organonitrile ligand with the general formula NCR, where R is a C2-C18 group.

2. The metal coordination complex of claim 1, wherein M is molybdenum.

3. The metal coordination complex of claim 1, wherein M is tungsten.

4. The metal coordination complex of claim 1, wherein each halogen is a chlorine atom.

5. The metal coordination complex of claim 1, wherein each L is selected from the group consisting of propionitrile ($NCCH_2CH_3$), butyronitrile ($NC(CH_2)_2CH_3$), isovaleronitrile ($NCCH_2CH(CH_3)_2$), pentanenitrile ($NC(CH_2)_3CH_3$), and hexanenitrile ($NC(CH_2)_4CH_3$).

6. The metal coordination complex of claim 1, wherein a melting point of the metal complex is less than or equal to 100° C.

7. The metal coordination complex of claim 1, wherein a melting point of the metal complex is less than or equal to 75° C.

8. The metal coordination complex of claim 1, wherein a melting point of the metal complex is less than or equal to 50° C.

9. The metal coordination complex of claim 1, wherein a melting point of the metal complex is less than or equal to 35° C.

10. A method of depositing a film, the method comprising exposing a substrate surface to a metal coordination complex comprising a general formula $MO_2X_2L_2$, where M is a metal selected from molybdenum or tungsten, each X is independently a halogen, each L is independently an organonitrile ligand with the general formula NCR, where R a C2-C18 group, and a reductant.

11. The method of claim 10, further comprising heating an ampoule containing the metal complex as a solid to a temperature greater than or equal to a melting point of the metal complex and flowing a carrier gas through the ampoule.

12. The method of claim 10, wherein the metal is molybdenum.

13. The method of claim 10, wherein the metal is tungsten.

14. The method of claim 10, wherein each L is selected from the group consisting of propionitrile ($NCCH_2CH_3$), butyronitrile ($NC(CH_2)_2CH_3$), isovaleronitrile ($NCCH_2CH(CH_3)_2$), pentanenitrile ($NC(CH_2)_3CH_3$), and hexanenitrile ($NC(CH_2)_4CH_3$).

15. A method of depositing a film, the method comprising exposing a substrate surface to a metal coordination complex having a general formula selected from the group consisting of $(MO_2X_2)_2L'$ and $MO_2X_2(L')$, where M is a metal atom selected from molybdenum and tungsten, and L' is a dinitrile bridging ligand, and a reductant.

16. The method of claim 15, wherein each of the metal atoms is molybdenum.

17. The method of claim 15, wherein each of the metal atoms is tungsten.

18. The method of claim 15, wherein L' connects two metal atoms.

19. The method of claim 15, wherein L' has a general formula $NC(CH_2)_xCN$, where x is in the range of 2 to 10.

20. The method of claim 15, wherein L' is selected from the group consisting of adiponitrile ($NCCH_2CH_2CH_2CH_2CN$) and 1,6-hexanedinitrile ($NCCH_2CH_2CH_2CH_2CH_2CH_2CN$).

* * * * *